United States Patent
Breitwisch et al.

(10) Patent No.: US 8,115,186 B2
(45) Date of Patent: Feb. 14, 2012

(54) PHASE CHANGE MEMORY CELL WITH REDUCED SWITCHABLE VOLUME

(75) Inventors: Matthew J. Breitwisch, Yorktown Heights, NY (US); Roger W. Cheek, Somers, NY (US); Eric Andrew Joseph, White Plains, NY (US); Chung Hon Lam, Peekskill, NY (US); Hsiang-Lan Lung, Elmsford, NY (US); Alejandro Gabriel Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 12/498,840

(22) Filed: Jul. 7, 2009

(65) Prior Publication Data

US 2009/0294748 A1    Dec. 3, 2009

Related U.S. Application Data

(62) Division of application No. 11/741,781, filed on Apr. 30, 2007, now abandoned.

(51) Int. Cl.
*H01L 29/02* (2006.01)
*H01L 47/00* (2006.01)

(52) U.S. Cl. .................................. 257/2; 257/E45.002
(58) Field of Classification Search ........ 257/2, E45.002
See application file for complete search history.

(56) References Cited

U.S. PATENT DOCUMENTS

2004/0251551 A1* 12/2004 Hideki ........................ 257/758
2006/0175599 A1*  8/2006 Happ ............................. 257/4

* cited by examiner

*Primary Examiner* — Alexander Ghyka
*Assistant Examiner* — Seahvosh Nikmanesh
(74) *Attorney, Agent, or Firm* — Vazken Alexanian; Ryan, Mason & Lewis, LLP

(57) ABSTRACT

A memory cell is fabricated by forming a dielectric layer and patterning a hole in the dielectric layer. Patterning the hole is accomplished at least in part by contacting the dielectric layer with a catalytic material in the presence of a reactant under conditions effective to remove those areas of the dielectric layer in contact with the catalytic material. A phase change feature is then formed in contact with the dielectric layer such that a portion of the phase change feature at least partially fills the hole in the dielectric layer. At least a portion of the patterned dielectric layer remains in the ultimate memory cell.

16 Claims, 4 Drawing Sheets

PHASE CHANGE MEMORY CELL WITH REDUCED SWITCHABLE VOLUME

CROSS-REFERENCE TO RELATED APPLICATION(S)

This application is a divisional of U.S. application Ser. No. 11/741,781 filed on Apr. 30, 2007, the disclosure of which is incorporated by reference herein.

FIELD OF THE INVENTION

This invention relates generally to memory cells in integrated circuits, and, more particularly, to memory cells comprising phase change materials for use in integrated circuits.

BACKGROUND OF THE INVENTION

The possibility of using phase change materials (PCMs) in nonvolatile memory cells has recently gained momentum as more is learned about these materials and their integration into integrated circuits. When incorporated in a memory cell, these materials can be toggled between higher and lower electrical resistance states by applying a pulse of electrical current ("switching current pulse") to the memory cell. After writing to a memory cell in this way, the electrical resistance state of the given memory cell can be determined (i.e., read) by applying a low magnitude sensing voltage to the material in order to determine its electrical resistance.

Currently, binary and ternary chalcogenide alloys such as doped antimony telluride (SbTe) and germanium antimony telluride ($Ge_2Sb_2Te_5$) (GST) are showing the greatest promise for use in practical PCM-based memory cells. However, the switching of a PCM-based memory cell requires that the switching current pulse produce enough heat in the PCM to cause at least some portion of the PCM to reproducibly change electrical resistance state. The required temperature may be as high 350 degrees Celsius. If the memory cell is not properly designed, the magnitude of the switching current pulse necessary to create these required temperatures can easily exceed that which can be tolerated by modern integrated circuits.

It has been recognized that the magnitude of the required switching current pulse can be reduced by forcing the current pulse to pass through an extremely narrow region of PCM. The confinement of the switching current to this narrow region results in high localized current density, and, in turn, in high localized ohmic heating. Nevertheless, it remains challenging to reliably and reproducibly form constricted regions of PCM with suitably narrow dimensions. Frequently, for example, such processing requires the formation of features that are smaller than those that can be formed using conventional photolithographic techniques. There remains, as a result, a need for methods of reliably and reproducibly forming constricted regions of PCM in PCM-based memory cells.

SUMMARY OF THE INVENTION

Embodiments of the present invention address the above-identified need by providing methods for reliably and reproducibly forming PCM-based memory cells with constricted PCM regions.

In accordance with an aspect of the invention, a memory cell is fabricated by forming a dielectric layer and patterning a hole in the dielectric layer. Patterning the hole is accomplished at least in part by contacting the dielectric layer with a catalytic material in the presence of a reactant under conditions effective to remove those areas of the dielectric layer in contact with the catalytic material. A phase change feature is then formed in contact with the dielectric layer such that a portion of the phase change feature at least partially fills the hole in the dielectric layer. At least a portion of the patterned dielectric layer remains in the ultimate memory cell.

In one of the above-identified embodiments, a memory cell comprises a dielectric layer comprising silicon dioxide. A hole is patterned in the dielectric layer by contacting the surface of the dielectric layer with a solid platinum catalytic feature in the presence of xenon difluoride ($XeF_2$) under temperature and pressure conditions selected to cause that region of the dielectric layer in contact with the catalytic feature to be selectively removed. The remainder of the dielectric layer remains substantially intact. Once the hole is formed in the dielectric layer, PCM is deposited on the dielectric layer such that a portion of the PCM fills the hole. When a switching current pulse is applied to the memory cell, it must pass through this narrow region of PCM. As a result, high localized current densities are created in the PCM in this portion of the memory cell.

Advantageously, the magnitude of the switching current pulse required to cause the PCM occupying the hole in the dielectric layer to make an electrical resistance state transition is substantially less than that which would be required to cause a transition in the remainder of the PCM volume. This memory cell design, therefore, utilizes high localized switching current density to reduce the required magnitude of the switching current pulse.

These and other features and advantages of the present invention will become apparent from the following detailed description which is to be read in conjunction with the accompanying figures.

DETAILED DESCRIPTION OF THE INVENTION

This invention will be illustrated herein in conjunction with exemplary memory cells for use in integrated circuits and methods for forming such memory cells. It should be understood, however, that the invention is not limited to the particular materials, features, and processing steps shown and described herein. Modifications to the illustrative embodiments will become apparent to those skilled in the art.

Particularly with respect to processing steps, it is emphasized that the descriptions provided herein are not intended to encompass all of the processing steps which may be required to successfully form a functional integrated circuit device. Rather, certain processing steps which are conventionally used in forming integrated circuit devices, such as, for example, wet cleaning and annealing steps, are purposefully not described for economy of description. However one skilled in the art will readily recognize those processing steps omitted from these generalized descriptions. Moreover, many details of the processing steps used to fabricate such integrated circuit devices may be found in a number of publications, for example, S. Wolf and R. N. Tauber, *Silicon Processing for the VLSI Era, Volume* 1, Lattice Press, 1986 and S. M.

Sze, *VLSI Technology, Second Edition*, McGraw-Hill, 1988, both of which are incorporated herein by reference.

The term "phase change material" (PCM) as used herein is intended to encompass any material displaying more than one programmable electrical resistance state for use in integrated circuits. PCMs comprise, for example, various chalcogenides and transition metal oxides and include, but are not limited to, doped or undoped GeSb, SbTe, $Ge_2Sb_2Te_5$ (GST), $SrTiO_3$, $BaTiO_3$, $(Sr, Ba)TiO_3$, $SrZrO_3$, $Ca_2Nb_2O_7$, $(Pr, Ca)MnO_3$, $Ta_2O_5$, $NiO_x$ and $TiO_x$, as well as other suitable materials.

It should also be understood that the various layers and/or regions shown in the accompanying figures are not drawn to scale, and that one or more layers and/or regions of a type commonly used in integrated circuits may not be explicitly shown in a given figure. For example, those integrated circuit features associated with what is commonly referred to as the front-end-of-line and middle-of-line are not described herein. This does not imply that the layers and/or regions not explicitly shown are omitted from the actual integrated circuit.

For ease of understanding, the design and operating characteristics of a PCM-based memory cell in accordance with an illustrative embodiment of the invention will be described first. Subsequently, methods for forming the illustrative memory cell embodiment in an integrated circuit will be addressed.

Figure 1:
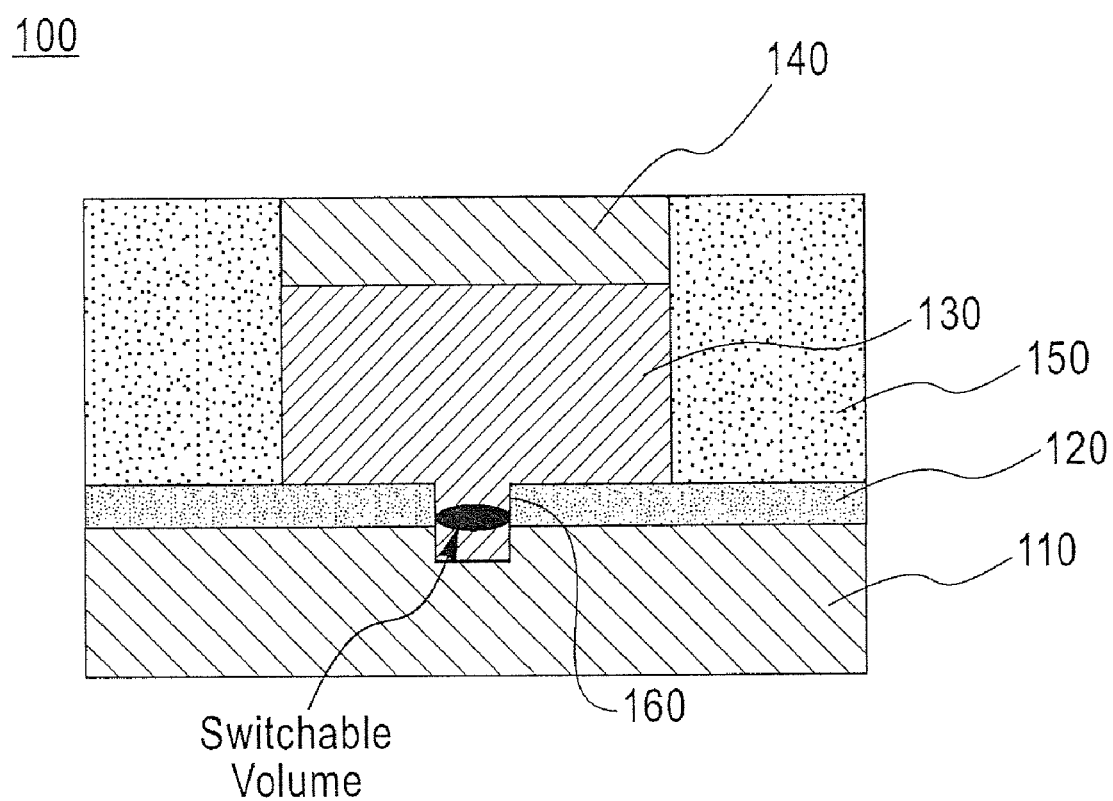
FIG. 1 shows a sectional view of a PCM-based memory cell in accordance with an illustrative embodiment of the invention.

FIG. 1 shows a memory cell 100 in accordance with an illustrative embodiment of the invention. The memory cell comprises a lower electrode 110, a lower dielectric layer 120, a PCM feature 130, an upper electrode 140, and an upper dielectric layer 150.

The lower electrode 110 comprises tungsten or titanium nitride while the upper electrode 140 comprises titanium nitride. Both the lower and upper dielectric layers 120, 150 comprise silicon dioxide, and the PCM feature 130 comprises GST. Nonetheless, these material choices are merely illustrative and any other suitable materials may be used in the place of the ones described herein. One or both of the lower and upper electrodes, for example, may comprise tantalum nitride instead of titanium nitride or tungsten. Additionally or alternatively, one or both of the dielectric layers may comprise silicon nitride. One skilled in the art will recognize the various advantages and disadvantages of making such substitutions.

Referring again to FIG. 1, it will be observed that the lower dielectric layer 110 comprises a hole 160 in which sits a portion of the PCM feature 130. The formation of this hole will be described in greater detail below. The hole in the dielectric layer allows the PCM feature to electrically contact the lower electrode 110.

Access to the memory cell 100 is preferably controlled via two metallic lines (not explicitly shown in FIG. 1) in what is commonly referred to as a cross point memory array configuration. One metallic line operates as a bitline while the other operates as a wordline. The lower electrode 110 is preferably in series with some kind of isolation device which, in turn, is controlled by the wordline. Such isolation devices are conventionally used in random access memory technologies that use resistance to indicate memory state. The isolation device may, for example, comprise a metal-oxide-semiconductor (MOS) transistor in series with the memory cell with the transistor's gate coupled to the wordline. The series MOS transistor allows the memory cell to be isolated from other memory cells when reading the memory cell. In contrast, the upper electrode 140 is preferably electrically coupled to the bitline. Additional timing logic, pulse generation, sensing, and drive circuitry are coupled to the wordline and bitline, allowing data to be written to and read from the memory cell in the manner indicated below. This additional circuitry is also conventionally used in memory circuitry and therefore will be familiar to one skilled in the art.

Writing data to the memory cell 100 comprises placing some portion of the total volume of the PCM feature 130 (the "switchable volume") into either a lower electrical resistance polycrystalline state or a higher electrical resistance amorphous state. Transitions between these states are accomplished by heating the PCM feature through the application of a pulse of switching current between the lower electrode 110 and the upper electrode 140. Advantageously, the placement of a portion of the PCM feature in the hole 160 in the lower dielectric layer 120 acts to force the switching current to pass through a constricted volume of PCM. When, for example, a switching current pulse is applied between the lower electrode and upper electrode, the switching current pulse first passes through the lower electrode and into the portion of the PCM feature filling the hole. Subsequently, the current travels through the remainder of the PCM feature and into the upper electrode.

The forcing of the switching current through the constricted region of the PCM feature 130 in the hole 160 in the lower dielectric layer 120 results in a high localized current density in this region of the PCM, and, in turn, in high ohmic heating. For this reason, the switchable volume of the PCM can be found in this region of the PCM feature (as indicated on FIG. 1). Outside of the hole in the lower dielectric layer, the current density in the PCM feature is insufficient to cause the transition between electrical resistance states. Accordingly, the magnitude of the required switching current pulse is substantially less than that which would be required to cause a state transition in the entire PCM feature. What is more, this memory cell design allows the magnitude of the switching current pulse to be readily tuned by adjusting the dimensions of the hole in the dielectric layer. The narrower the hole, the more constricted a region of PCM through which the switching current must pass. Through this kind of tuning, the magnitude of the switching current pulse may be readily adjusted to a value that is compatible with modern integrated circuits.

The duration of the switching current pulse is preferably between about 1 and about 500 nanoseconds and has a fast falling edge (e.g., less than about ten nanoseconds), although the invention is not limited to any particular duration and/or rise or fall time of the switching current pulse. The fast falling edge acts to freeze the switchable volume of the PCM feature 130 in its current electrical resistance state without allowing additional time for the bonds within the material to continue to rearrange.

Reading the state of the memory cell 100 may be accomplished by applying a sensing voltage to the memory cell, again via the lower and upper electrodes 110, 140. The ratio of the electrical resistances between the higher and lower electrical resistance states in a typical two-state PCM is between about 100:1 and 1,000:1. The sensing voltage is preferably of low enough magnitude to provide negligible ohmic heating in the PCM feature 130. Accordingly, the electrical resistance state of the PCM feature may be determined in this manner without disturbing its written electrical resistance state. Data integrity is thereby maintained while reading the data.

Figure 2:
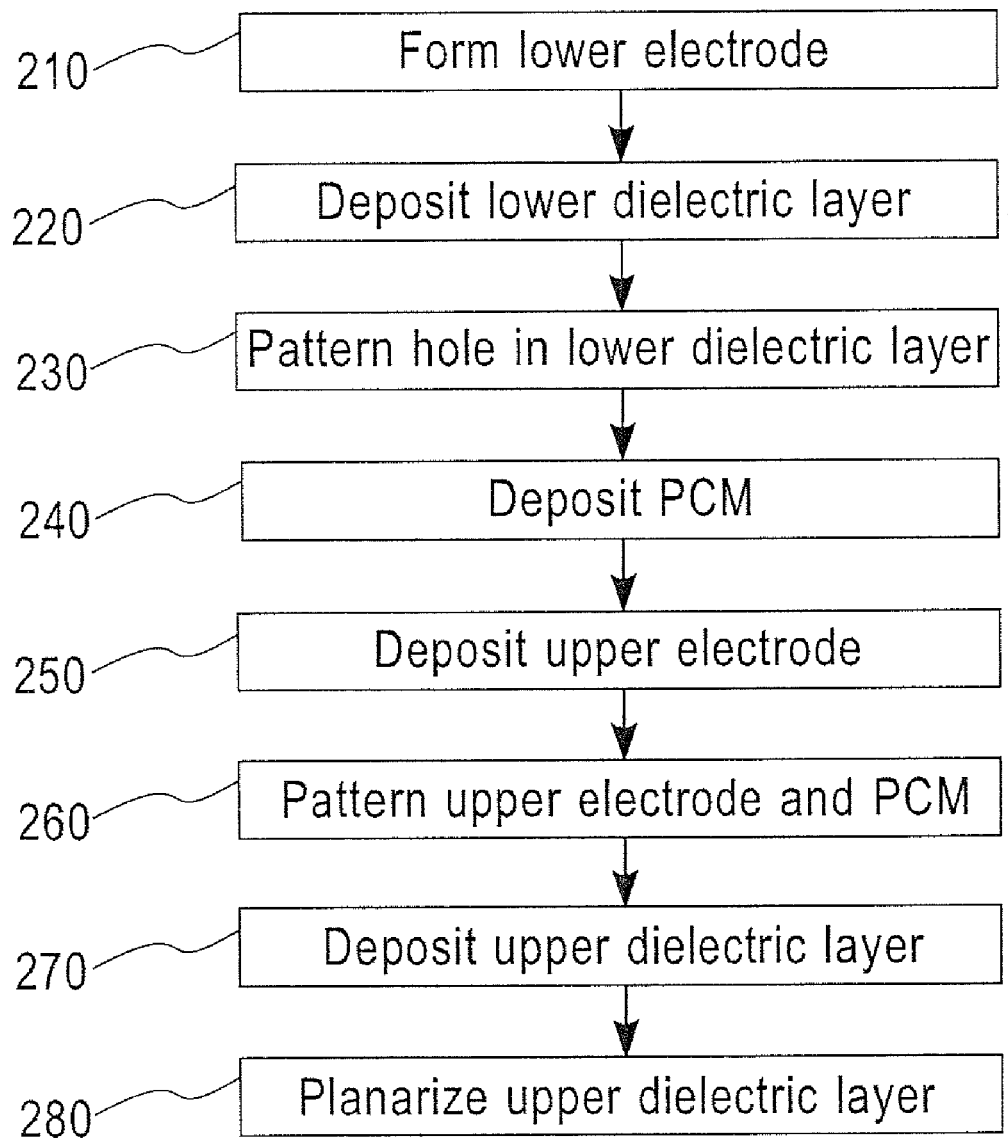
FIG. 2 shows a flow diagram of an illustrative method of forming the FIG. 1 memory cell.

FIG. 2 shows a flow diagram of an illustrative method of forming the memory cell 100, while FIGS. 3A-3E show sectional views of the memory cell during various stages in its formation. Initially, in step 210, a layer of electrode material for the lower electrode 110 (e.g., titanium nitride or tungsten) is deposited on whatever structures underlie the memory cell and then patterned to form the lower electrode. Subsequently, in step 220 the lower dielectric layer 120 (e.g., silicon dioxide) is deposited on the lower electrode. The resultant film stack in shown in FIG. 3A.

Figure 3A:
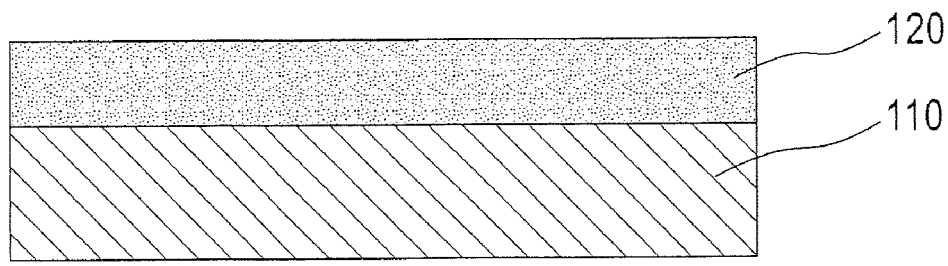
FIGS. 3A-3E show sectional views of the FIG. 1 memory cell during various stages of its formation.
Figure 3B:
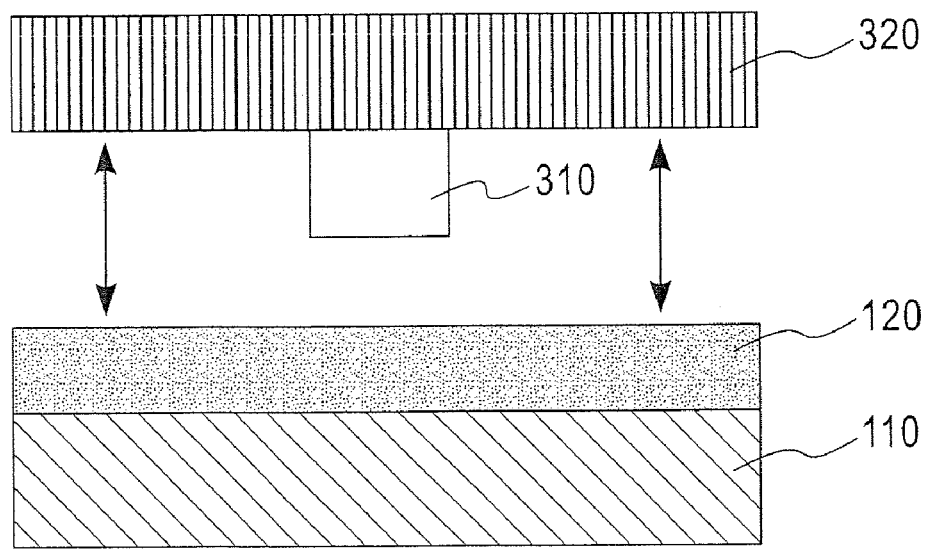

Step 230 in FIG. 2 comprises patterning the hole 160 in the lower dielectric layer 120. In accordance with an aspect of the invention, this is accomplished using a method for the selective removal of material similar to that described in U.S. Pat. No. 6,022,485 to Cheek, entitled "Method for Controlled Removal of Material From a Solid Surface," which is incorporated by reference herein. In this selective removal process, the surface of the lower dielectric layer is contacted by a solid catalytic feature 310 in the presence of a reactant, as shown in FIG. 3B. Conditions are selected such that that the region of the lower dielectric layer in contact with the catalytic feature is selectively removed while the remainder of the lower dielectric layer remains substantially intact.

Reference to FIG. 3B indicates that the catalytic feature 310 is attached to an inert support 320 comprising, for example, a glass, a metal, or a polymer. The catalytic feature is preferably formed in the three-dimensional shape of the desired hole 160 in the lower dielectric layer 120. The catalytic feature may be formed in this shape by first depositing a layer of the catalytic material on the inert support (e.g., using conventional sputter deposition or chemical vapor deposition) and then using patterning techniques well known to those skilled in the art. Of course, it is recognized that the inert substrate will typically comprise a plurality of catalytic features arranged in a repeating pattern when utilized to produce an actual integrated circuit.

If the lower dielectric layer 120 comprises silicon dioxide, the catalytic feature 310 preferably comprises solid platinum, although other suitable materials or combinations of materials may be utilized. The reactant, on the other hand, will preferably comprise xenon difluoride ($XeF_2$) gas or some other suitable fluorine-containing gas. Platinum catalytically etches silicon dioxide in the presence xenon difluoride. Conditions employed to effectively remove portions of the lower dielectric layer may vary over a wide range. Nevertheless, generally, temperature is from about 350° to about 450° Celsius and total pressure is from about 0.5 to 1 pounds-per-square-inch-gauge (psig). The reactant partial pressure is typically from about 0.005 to about 0.01 psig. Time for the reaction may be between about 1 and about 20 seconds depending on the thickness of the lower dielectric layer as well as the other reaction conditions.

One skilled in the art will recognize that the proper choice of the catalytic material, reactant, and processing conditions will strongly depend on the composition of the lower dielectric layer 120. For example, depending on the material to be selectively removed, several materials or combinations of materials from Groups IVB, VB, VIB, and VIII of the Periodic Table of the Elements may be useful as catalytic features, while oxygen- and chlorine-containing molecules may be useful as reactants. The reactant may even be delivered in liquid phase. Effective combinations of catalytic materials, reactants, and processing conditions for different lower dielectric layer compositions will be known to one skilled in the art. As a result, several variations may be made to the selective removal process in step 230 in FIG. 2 and the results will still come within the scope of the invention.

It should be noted that the hole 160 in the lower dielectric layer 120 may be of any desired shape in a plane parallel to the dielectric layer (e.g., square, rectangular, oval, or round). The hole will typically match the shape of the catalytic feature 310. As a result, modifying the shape of the catalytic feature becomes a convenient way of tuning the power requirements of the memory cell 100 since the dimensions of the hole in the dielectric layer directly affect the switching current magnitude required to cause phase transitions in the PCM feature 130. Moreover, the use of the processing sequence just described allows the hole in the lower dielectric layer to have dimensions that are substantially smaller than those which can be formed by conventional photolithograpic techniques.

Figure 3C:
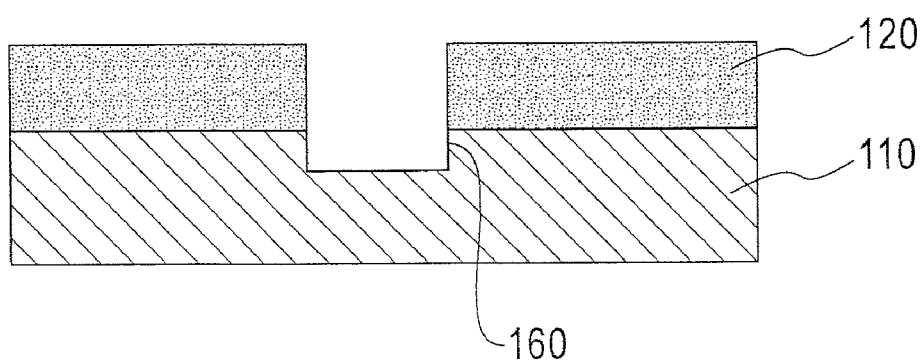
Figure 3D:
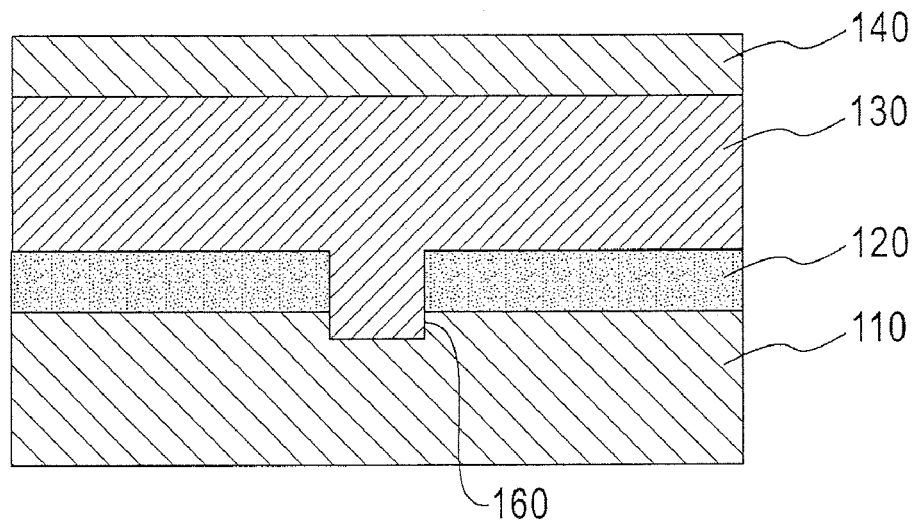
Figure 3E:
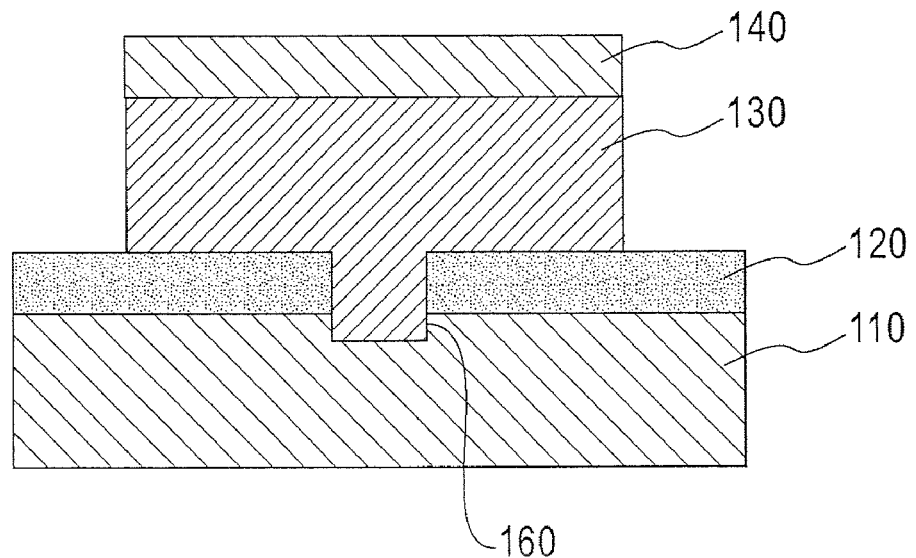

After performing the patterning of the hole 160 in the lower dielectric layer 120, the resultant film stack will appear as shown in FIG. 3C. The selective removal process may etch somewhat into the lower electrode 110, as indicated in the figure. A layer of PCM for the PCM feature 130 (e.g., GST) is then deposited on the lower dielectric layer in step 240 by, for example, sputter deposition. The deposition preferably has good gap filling characteristics so that the PCM fully fills the hole. Subsequently, in step 250, a layer of electrode material for the upper electrode 140 is deposited on the layer of PCM, resulting in the film stack shown in FIG. 3D. In step 260, conventional photolithography and anisotropic etching (e.g., reactive ion etching) are utilized to pattern the layer of electrode material and the layer of PCM to form the upper electrode and the PCM feature as shown in FIG. 3E. During this patterning process, developed photoresist may be utilized to pattern both the upper electrode and the PCM feature. Alternatively, the upper electrode may be etched first with the photoresist in place, the photoresist removed, and then the PCM feature etched using the upper electrode as a hard mask. One skilled in the art will recognize the relative merits of both patterning techniques.

Once the film stack appears as shown in FIG. 3E, only a few processing steps remain to convert the film stack into the memory cell 100 shown in FIG. 1. In step 270 of FIG. 2, a layer of dielectric material for the upper dielectric layer 150 (e.g., silicon dioxide) is conformally deposited on the film stack. In step 270, chemical mechanical polishing is used to planarize this layer of dielectric material, removing any dielectric material from the top of the upper electrode and forming the upper dielectric layer as it appears in FIG. 1.

The PCM-based memory cell 100 described above is part of the design for an integrated circuit chip. The chip design may be created in a graphical computer programming language, and stored in a computer storage medium (such as a disk, tape, physical hard drive or virtual hard drive such as in a storage access network). If the designer does not fabricate chips or photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are formed on a wafer. The photolithographic masks are utilized to define areas of the wafer (and/or the layers thereon) to be etched or otherwise processed.

The resulting integrated circuit chips may be distributed by the fabricator in raw wafer form (i.e., as a single wafer that has multiple unpackaged chips), as a bare die, or in packaged form. In the latter case, the chip is mounted in a single chip package (e.g., plastic carrier with leads that are affixed to a motherboard or other higher level carrier) or in a multichip package (e.g., ceramic carrier that has either or both surface interconnections or buried interconnections). In any case, the chip is then integrated with other chips, discrete circuit elements, and/or other signal processing devices as part of either an intermediate product (e.g., motherboard) or an end product. The end product may be any product that includes integrated circuit chips, ranging from toys and other low-end applications to advanced computer products having a display, a keyboard or other input device, and a central processor.

Although illustrative embodiments of the present invention have been described herein with reference to the accompanying figures, it is to be understood that the invention is not limited to those precise embodiments. For example, the materials utilized in the illustrative embodiments and the particular sequence of processing steps used to fabricate the illustrative embodiments may be changed without departing from the scope of the appended claims. These changes and various other modifications will be evident to one skilled in the art.

What is claimed is:

1. An integrated circuit comprising one or more memory cells, at least one of the one or more memory cells comprising:
   a first electrode;
   a dielectric layer formed on the first electrode;
   an opening in the dielectric layer formed down to the first electrode, wherein an average width of the opening in the dielectric layer is less than a prescribed minimum lithographic dimension;
   a phase change feature formed on the dielectric layer, a portion of the phase change feature filling the opening in the dielectric layer so that the phase change feature is in direct contact with the first electrode through said opening;
   wherein at least a portion of the patterned dielectric layer remains in the ultimate memory cell; and
   a support structure comprising at least one of a glass, a metal, and a polymer, and a catalytic material supported by the support structure, wherein the catalytic material is in contact with the dielectric layer in the presence of a reactant under conditions effective to remove those areas of the dielectric layer in contact with the catalytic material to form said opening in the dielectric layer.

2. The integrated circuit of claim 1, wherein the integrated circuit comprises random access memory circuitry.

3. The integrated circuit of claim 1, wherein the integrated circuit comprises nonvolatile memory circuitry.

4. The integrated circuit of claim 1, wherein a fraction of the phase change feature is operative to switch between lower and higher electrical resistance states in response to an application of an electrical signal to the at least one memory cell.

5. The integrated circuit of claim 4, wherein the fraction of the phase change feature operative to switch between lower and higher electrical resistance states is substantially located within the opening in the dielectric layer.

6. The integrated circuit of claim 1, wherein the at least one memory cell further comprises a second electrode formed on the phase change feature.

7. The integrated circuit of claim 1, wherein the dielectric layer comprises silicon dioxide.

8. The integrated circuit of claim 1, wherein the catalytic material comprises at least one material selected from at least one of Group IVB, VB, VIB, VIIB, and VIII of the Periodic Table of the Elements.

9. The integrated circuit of claim 1, wherein the catalytic material comprises platinum.

10. The integrated circuit of claim 1, wherein the reactant comprises a liquid or a gas.

11. The integrated circuit of claim 1, wherein the reactant comprises at least one of chlorine atoms, oxygen atoms, and fluorine atoms.

12. The integrated circuit of claim 1, wherein the dielectric layer comprises silicon dioxide, the catalytic material comprises platinum, and the reactant comprises fluorine atoms.

13. The integrated circuit of claim 1, wherein the reactant comprises xenon difluoride.

14. The integrated circuit of claim 1, wherein the phase change feature comprises at least one of germanium, antimony, sulfur, selenium, and tellurium.

15. The integrated circuit of claim 1, wherein the phase change feature comprises a ternary alloy comprising germanium, antimony, and tellurium.

16. The integrated circuit of claim 1, wherein the phase change feature comprises a transition metal oxide.

* * * * *